United States Patent
Arai

(10) Patent No.: US 9,196,494 B2
(45) Date of Patent: Nov. 24, 2015

(54) SEMICONDUCTOR DEVICE AND METHOD OF MANUFACTURING THE SAME

(75) Inventor: Shinya Arai, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 399 days.

(21) Appl. No.: 13/590,311

(22) Filed: Aug. 21, 2012

(65) Prior Publication Data

US 2013/0228892 A1 Sep. 5, 2013

(30) Foreign Application Priority Data

Mar. 5, 2012 (JP) ................................. 2012-048061

(51) Int. Cl.
*H01L 21/8239* (2006.01)
*H01L 27/108* (2006.01)
*H01L 21/28* (2006.01)
*H01L 27/115* (2006.01)
*H01L 21/762* (2006.01)

(52) U.S. Cl.
CPC .... *H01L 21/28273* (2013.01); *H01L 21/76232* (2013.01); *H01L 27/10873* (2013.01); *H01L 27/10891* (2013.01); *H01L 27/10894* (2013.01); *H01L 27/11521* (2013.01)

(58) Field of Classification Search
CPC .................................................. H01L 21/8239
See application file for complete search history.

(56) References Cited

U.S. PATENT DOCUMENTS

| | | | |
|---|---|---|---|
| 2004/0195608 A1* | 10/2004 | Kim et al. | 257/296 |
| 2008/0023774 A1 | 1/2008 | Sato et al. | |
| 2008/0128825 A1 | 6/2008 | Sato et al. | |
| 2009/0026527 A1* | 1/2009 | Ryusenji et al. | 257/316 |
| 2009/0221137 A1 | 9/2009 | Matsui | |

FOREIGN PATENT DOCUMENTS

| | | |
|---|---|---|
| JP | 2006-93649 | 4/2006 |
| JP | 2008-34413 | 2/2008 |
| JP | 2008-140853 | 6/2008 |
| JP | 2009-94439 | 4/2009 |
| JP | 2009-231799 | 10/2009 |

* cited by examiner

*Primary Examiner* — Mohammad Choudhry
(74) *Attorney, Agent, or Firm* — Oblon, McClelland, Maier & Neustadt, L.L.P.

(57) ABSTRACT

In one embodiment, a semiconductor device includes a semiconductor substrate, isolation regions disposed in the semiconductor substrate, and device regions disposed between the isolation regions in the semiconductor substrate. The device further includes a first line disposed on the device regions and the isolation regions, a line width of the first line on the isolation regions being larger than a line width of the first line on the device regions.

8 Claims, 12 Drawing Sheets

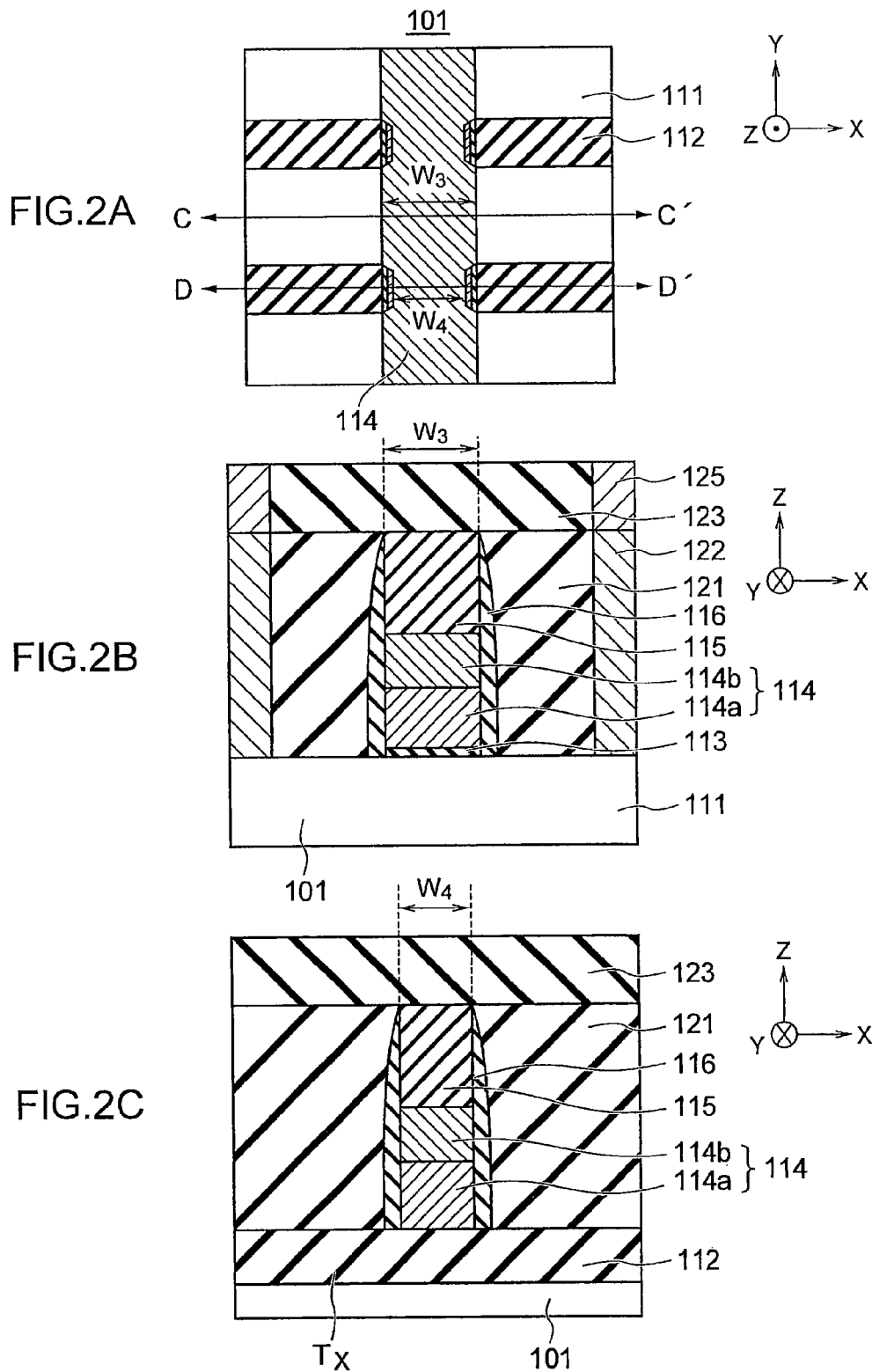

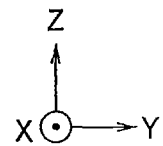
FIG.3A
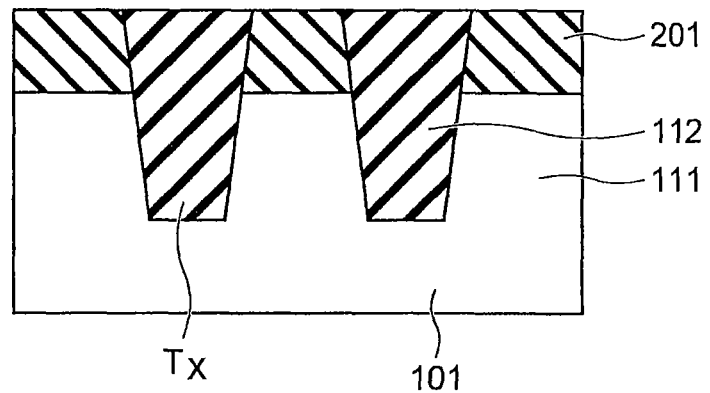
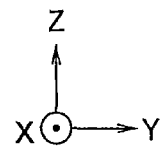
FIG.3B
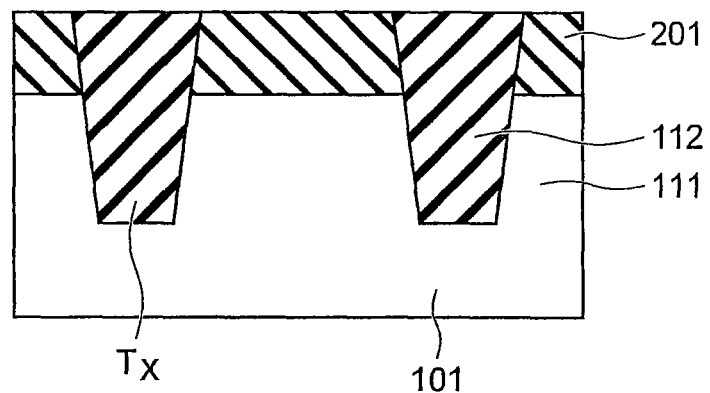

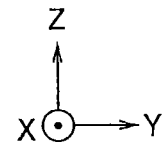
FIG.4A
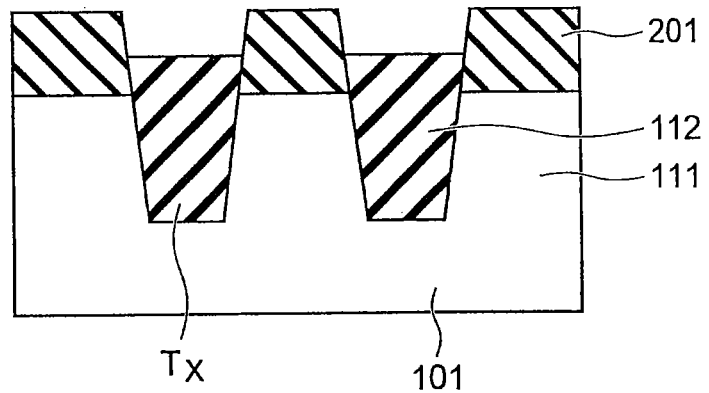
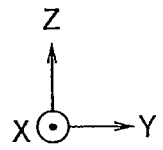
FIG.4B
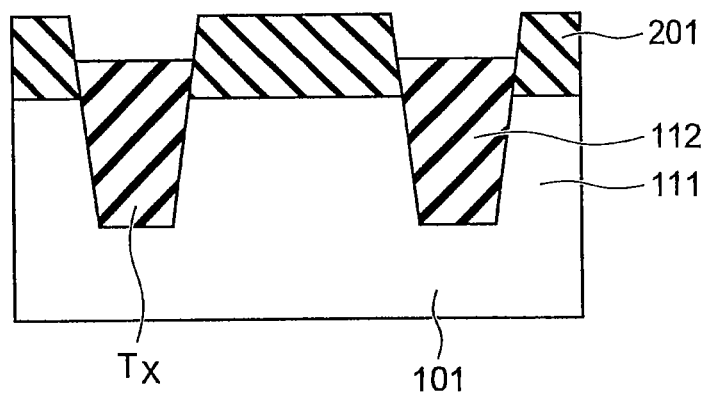

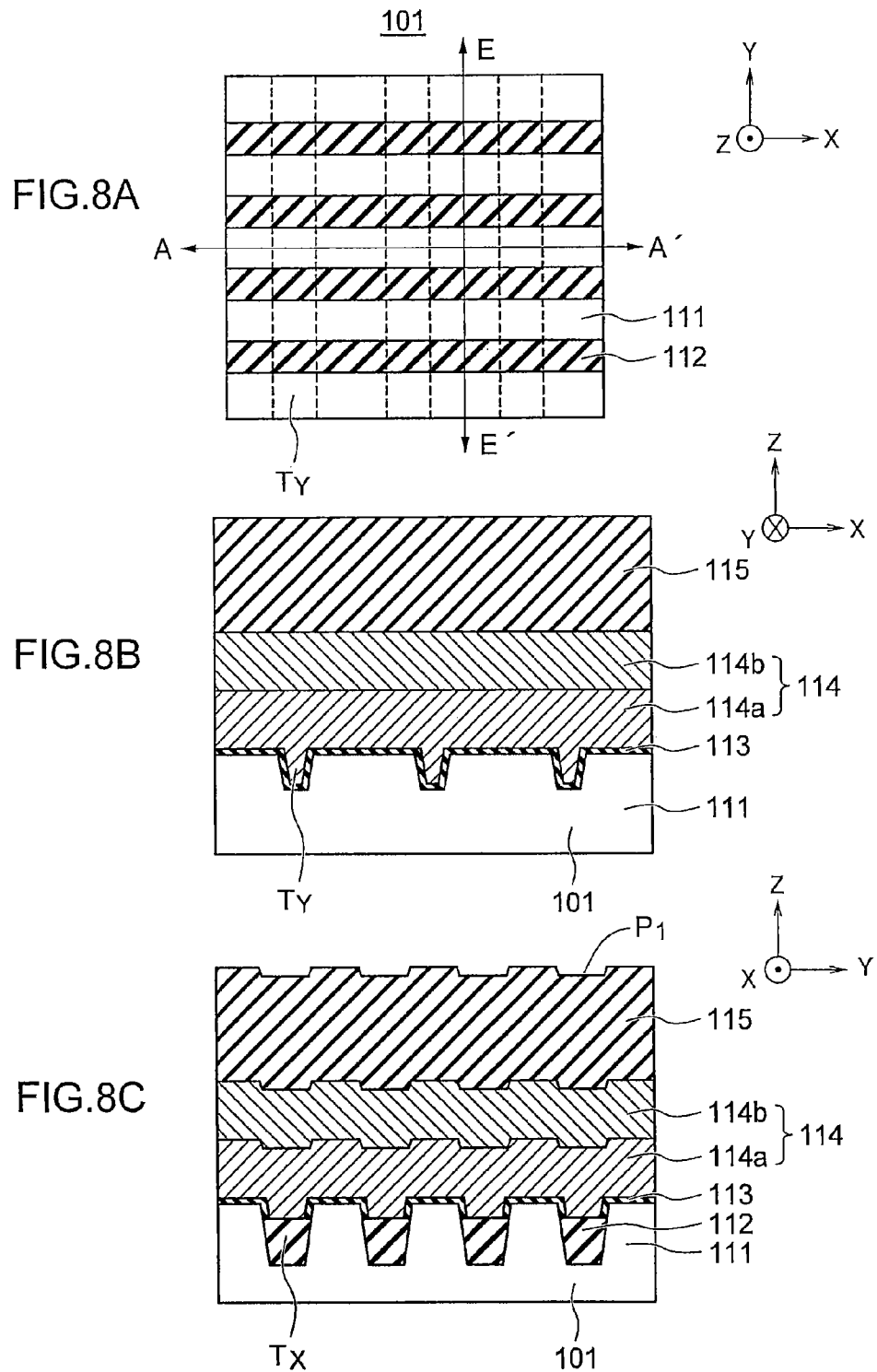

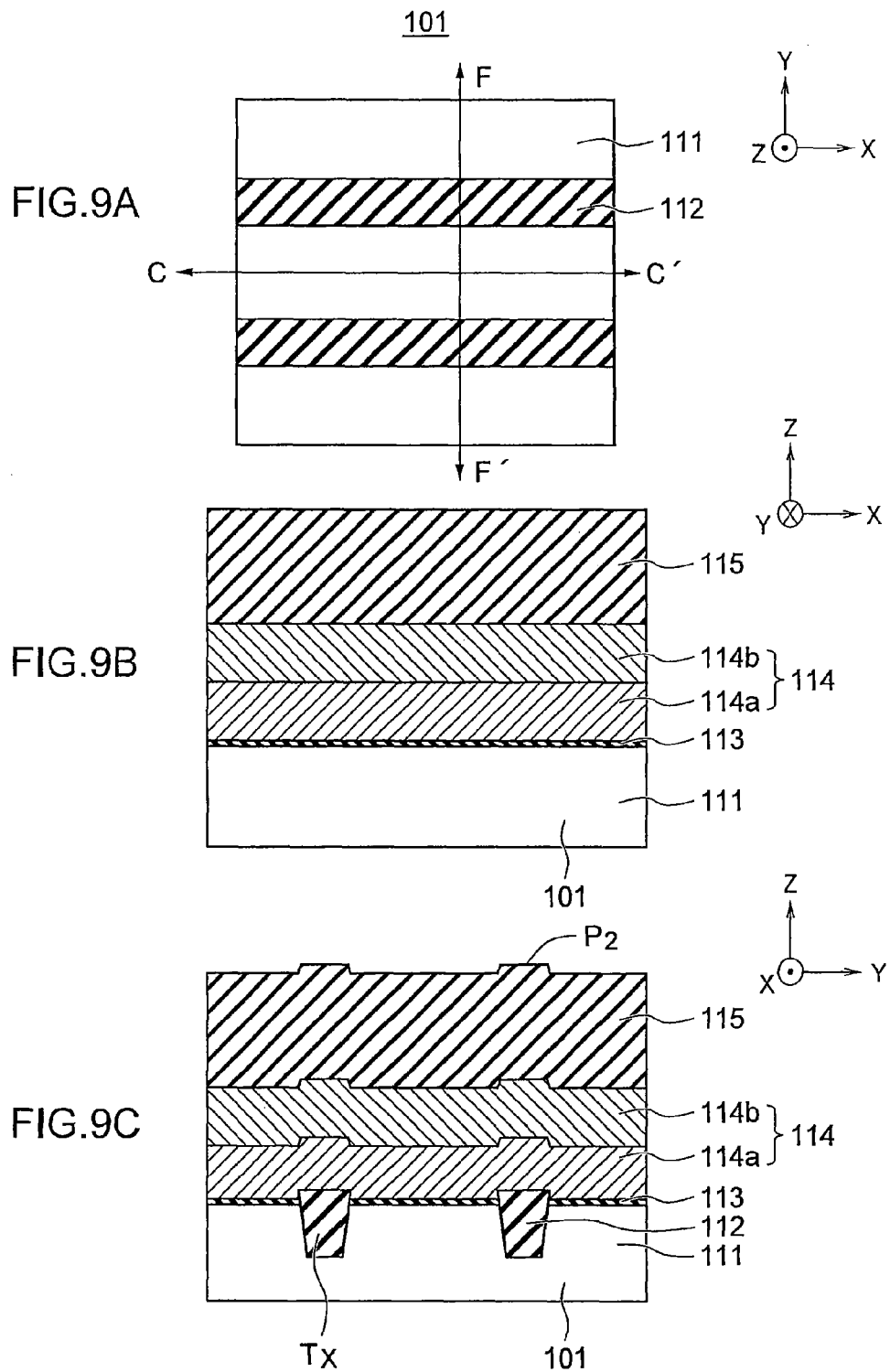

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2012-48061, filed on Mar. 5, 2012, the entire contents of which are incorporated herein by reference.

FIELD

Embodiments described herein relate to a semiconductor device and a method of manufacturing the same.

BACKGROUND

A gate electrode of a dynamic random access memory (DRAM) is also used as a word line. In order to decrease resistance of the word line, a part of the gate electrode is formed of a metal film. However, it is known that as a line width of the word line becomes smaller, resistivity of the metal film increases due to a thin line effect. As a result, the resistance of the word line increases, and variations in resistance of word lines become larger. The increase of the resistivity due to the thin line effect becomes particularly notable when the line width is 30 nm or less.

BRIEF DESCRIPTION OF THE DRAWINGS

FIGS. 1A to 2C are plan views and sectional views showing a structure of a semiconductor device of a first embodiment;

FIGS. 3A to 11C are plan views and sectional views showing a method of manufacturing the semiconductor device of the first embodiment.

DETAILED DESCRIPTION

Embodiments will now be explained with reference to the accompanying drawings.

In one embodiment, a semiconductor device includes a semiconductor substrate, isolation regions disposed in the semiconductor substrate, and device regions disposed between the isolation regions in the semiconductor substrate. The device further includes a first line disposed on the device regions and the isolation regions, a line width of the first line on the isolation regions being larger than a line width of the first line on the device regions.

(First Embodiment)
(1) Structure of Memory Cell Array Part

Figure 1A:
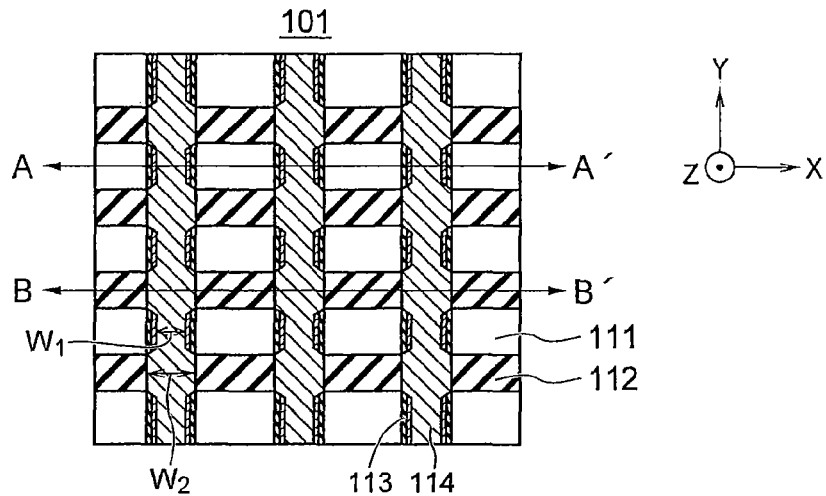
Figure 1B:
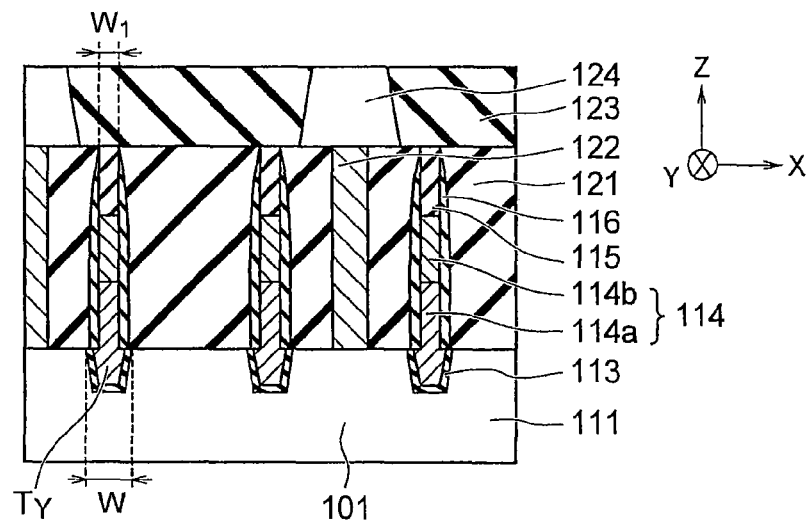
Figure 1C:
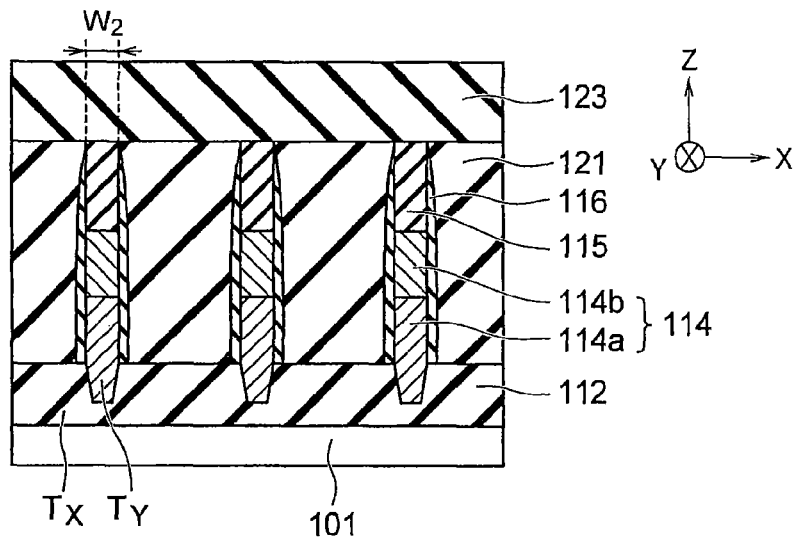

FIGS. 1A to 1C are a plan view and sectional views showing a structure of a semiconductor device of a first embodiment. The semiconductor device of FIGS. 1A to 1C is a DRAM.

FIG. 1A is a plan view showing a structure of a memory cell array part on a semiconductor substrate 101. FIGS. 1B and 1C are sectional views taken along a line A-A' and a line B-B' shown in FIG. 1A, respectively. FIGS. 1A to 1C show memory cell transistors formed in the memory cell array part.

The semiconductor device of FIGS. 1A to 1C includes the semiconductor substrate 101, device regions 111, and isolation regions 112. Each memory cell transistor of the semiconductor device of FIGS. 1A to 1C includes a gate insulator 113, a gate electrode 114, a hard mask layer 115, and sidewall insulators 116. The semiconductor device of FIGS. 1A to 1C further includes an inter layer dielectric 121, contact plugs 122, an inter layer dielectric 123, and capacitors 124.

The semiconductor substrate 101 is, for example, a silicon substrate. FIGS. 1A to 1C show directions X and Y which are parallel to a principal surface of the semiconductor substrate 101 and perpendicular to each other, and a direction Z which is perpendicular to the principal surface of the semiconductor substrate 101.

The isolation regions 112 are formed in the semiconductor substrate 101, and extend in the direction X. The isolation regions 112 are also referred to as shallow trench isolation (STI) regions. For example, the isolation regions 112 are formed by forming trenches $T_X$ on the surface of the semiconductor substrate 101, and embedding a silicon oxide film in the trenches $T_X$.

The device regions 111 are formed between the isolation regions 112 in the semiconductor substrate 101, and extend in the direction X. The device regions 111 are also referred to as active area (AA) regions. The device regions 111 are electrically isolated from each other by the isolation regions 112.

The gate insulator 113 is formed on the surface of the semiconductor substrate 101. The gate insulator 113 is, for example, a silicon oxide film. The gate electrode 114 is formed on the semiconductor substrate 101 via the gate insulator 113. The gate electrode 114 is, for example, a stack film formed by sequentially stacking a polysilicon film 114a and a metal film 114b. The polysilicon film 114a is an example of a semiconductor film of the disclosure. Examples of the metal film 114b include a tungsten film.

Reference sign $T_Y$ denotes trenches formed on the surface of the device regions 111 and the isolation regions 112. The gate insulator 113 of the present embodiment is formed on the surface of a trench $T_Y$. The gate electrode 114 in the present embodiment is partially embedded in the trench $T_Y$.

The gate electrode 114 extends in the direction Y, and is formed on the device regions 111 and the isolation regions 112. The gate electrode 114 in FIGS. 1A to 1C is also used as an interconnect of the DRAM, more specifically, as a word line. The gate electrode 114 in FIGS. 1A to 1C is an example of a first line of the disclosure.

The hard mask layer 115 is formed on the gate electrode 114. The sidewall insulators 116 are formed on the side surfaces of the gate electrode 114 and the hard mask layer 115. The hard mask layer 115 is, for example, a silicon nitride film. The sidewall insulators 116 are, for example, silicon nitride films or silicon oxide films.

The inter layer dielectric 121 is formed on the semiconductor substrate 101 so as to surround the memory cell transistors. The inter layer dielectric 121 is, for example, a silicon oxide film. The contact plugs 122 are formed in the inter layer dielectric 121, and are electrically connected to the semiconductor substrate 101. The contact plugs 122 are, for example, tungsten films.

The inter layer dielectric 123 is formed on the inter layer dielectric 121 so as to cover the capacitors 124. The inter layer dielectric 123 is, for example, a silicon oxide film. The capacitors 124 are formed in the inter layer dielectric 123, and are electrically connected to the contact plugs 122. The capacitors 124 are used as memory elements of the DRAM.

The semiconductor device of FIGS. 1A to 1C may be a magnetic random access memory (MRAM). In this case, the capacitors 124 are replaced with magnetic tunnel junction (MTJ) elements.

The AA section shown in FIG. 1B is now compared with the STI section shown in FIG. 1C.

In FIG. 1B, the word lines (gate electrodes) 114 are formed on the device regions 111. Reference sign "$W_1$" denotes a line width of the word lines 114 on the device regions 111.

In FIG. 1C, the word lines 114 are formed on the isolation regions 112. Reference sign "$W_2$" denotes a line width of the word lines 114 on the isolation regions 112.

In the present embodiment, the line width "$W_2$" of the word lines 114 on the isolation regions 112 is set larger than the line width "$W_1$" of the word lines 114 on the device regions 111 ($W_2 > W_1$). Therefore, according to the present embodiment, it becomes possible to decrease the resistance of the word lines 114 on the isolation regions 112, thereby decreasing the total resistance of the word lines 114.

According to the present embodiment, the increase of the line width "$W_2$" makes it possible to reduce the thin line effect of the word lines 114 on the isolation regions 112, and to thereby reduce the resistivity of the word lines 114 on the isolation regions 112. Therefore, according to the present embodiment, it becomes possible to decrease the resistance of the word lines 114 and to suppress variations in resistance of the word lines 114.

The thin line effect of the word lines 114 becomes notable when the line width is 30 nm or less. Accordingly, the setting of "$W_2 > W_1$" is effective when the line width "$W_1$" is 30 nm or less. This is because the increase of the line width "$W_2$" can significantly reduce the thin line effect of the word lines 114 on the isolation region 112. However, the setting of "$W_2 > W_1$" is applied not only when the line width "$W_1$" is 30 nm or less, but is also effective when the line width "$W_1$" is larger than 30 nm.

Reference sign "W" denotes a width of the trenches $T_Y$. The line widths "$W_1$" and "$W_2$" may be larger or smaller than the width "W". The line width "$W_1$" smaller than the width "W" has an advantage that the contact plugs 122 are easily placed. The line width "$W_2$" larger than the width "W" has an effect that the resistance of the word lines 114 can be decreased as compared with the case where the line width "$W_2$" is smaller than the width "W".

(2) Structure of Peripheral Circuit Part

A peripheral circuit part on the semiconductor substrate 101 is now described with reference to FIGS. 2A to 2C.

FIGS. 2A to 2C are a plan view and sectional views showing the structure of the semiconductor device of the first embodiment, similarly to FIGS. 1A to 1C.

FIG. 2A is a plan view showing a structure of the peripheral circuit part on the semiconductor substrate 101. FIGS. 2B and 2C are sectional views taken along a line C-C and a line D-D' shown in FIG. 2A, respectively. FIGS. 2A to 2C show peripheral transistors formed in the peripheral circuit part.

FIGS. 2A to 2C show the semiconductor substrate 101, the device regions 111, and the isolation regions 112, similarly to FIGS. 1A to 1C. FIGS. 2A to 2C further show the peripheral transistors, each of which includes the gate insulator 113, the gate electrode 114, the hard mask layer 115, and the sidewall insulators 116. FIGS. 2A to 2C further show the inter layer dielectric 121, the contact plugs 122, and the inter layer dielectric 123, similarly to FIGS. 1A to 1C. FIGS. 2A to 2C further show via plugs 125 formed on the contact plugs 122.

The gate electrode 114 extends in the direction Y, and is formed on the device regions 111 and the isolation regions 112. The gate electrode 114 in FIGS. 2A to 2C is also used as an interconnect of the DRAM, more specifically, as a gate line in the peripheral circuit part. The gate electrode 114 in FIGS. 2A to 2C is an example of a second line of the disclosure. It should be noted that the gate electrode 114 in FIGS. 2A to 2C is not embedded in a trench $T_Y$.

The AA section shown in FIG. 2B is now compared with the STI section shown in FIG. 2C.

In FIG. 2B, the gate lines (gate electrodes) 114 are formed on the device regions 111. Reference sign "$W_3$" denotes a line width of the gate lines 114 on the device regions 111.

In FIG. 2C, the gate lines 114 are formed on the isolation regions 112. Reference sign "$W_4$" denotes a line width of the gate lines 114 on the isolation regions 112.

As described above, in the memory cell array part of FIGS. 1A to 1C, the line width "$W_2$" of the word lines 114 on the isolation regions 112 is set larger than the line width "$W_1$" of the word lines 114 on the device regions 111 ($W_2 > W_1$).

On the other hand, in the peripheral circuit part of FIGS. 2A to 2C, the line width "$W_4$" of the gate lines 114 on the isolation regions 112 may be larger or smaller than the line width "$W_3$" of the gate lines 114 on the device regions 111, or may be equal to the line width "$W_3$". FIGS. 2A to 2C show the gate lines 114 in which the line width "$W_4$" is smaller than the line width "$W_3$" as an example ($W_4 < W_3$).

In the memory cell array part of the present embodiment, the height of the upper surfaces of the isolation regions 112 is set lower than the height of the upper surfaces of the device regions 111. In the present embodiment, the word lines 114 are formed under this setting, so that the line width "$W_2$" becomes larger than the line width "$W_1$" in a self-aligned manner. This processing will be described later in detail.

In the peripheral circuit part of the present embodiment, the height of the upper surfaces of the isolation regions 112 is set higher than the height of the upper surfaces of the device regions 111. In the present embodiment, the gate lines 114 are formed under this setting, so that the line width "$W_4$" becomes smaller than the line width "$W_3$" in a self-aligned manner. This processing will be described later in detail.

(3) Method of Manufacturing Semiconductor Device of First Embodiment

A method of manufacturing the semiconductor device of the first embodiment is now described with reference to FIGS. 3A to 11C.

FIGS. 3A to 11C are plan views and sectional views showing the method of manufacturing the semiconductor device of the first embodiment.

FIGS. 3A, 4A, . . . , 7A show sections of the memory cell array part, and FIGS. 3B, 4B, . . . , 7B show sections of the peripheral circuit part.

First, as shown in FIGS. 3A and 3B, a hard mask layer 201 is formed on the semiconductor substrate 101. The hard mask layer 201 is, for example, a silicon nitride film. As shown in FIGS. 3A and 3B, the trenches $T_X$ extending in the direction X are then formed in the semiconductor substrate 101 and the hard mask layer 201. As shown in FIGS. 3A and 3B, an insulator (e.g., a silicon oxide film) is then embedded in the trenches $T_X$, and the surface of the insulator is planarized by chemical mechanical polishing (CMP). As a result, the isolation regions (isolation insulators) 112 are formed in the trenches $T_X$. In addition, the device regions 111 are formed between the isolation regions 112.

As shown in FIGS. 4A and 4B, only the isolation insulators 112 are then recessed by wet etching so that the height of the upper surfaces of the isolation insulators 112 is adjusted to be a desired height. In this case, the height of the upper surfaces of the isolation insulators 112 is made higher than the height of the upper surfaces of the device regions 111.

Figure 5A:
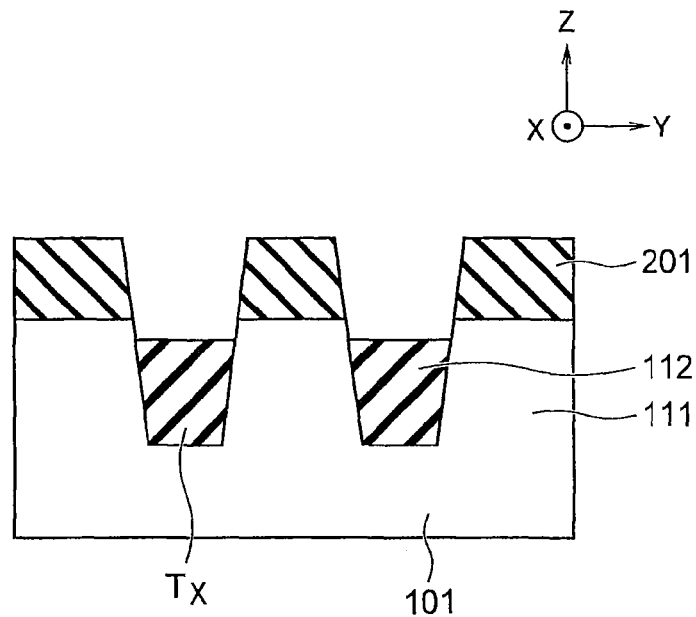
Figure 5B:
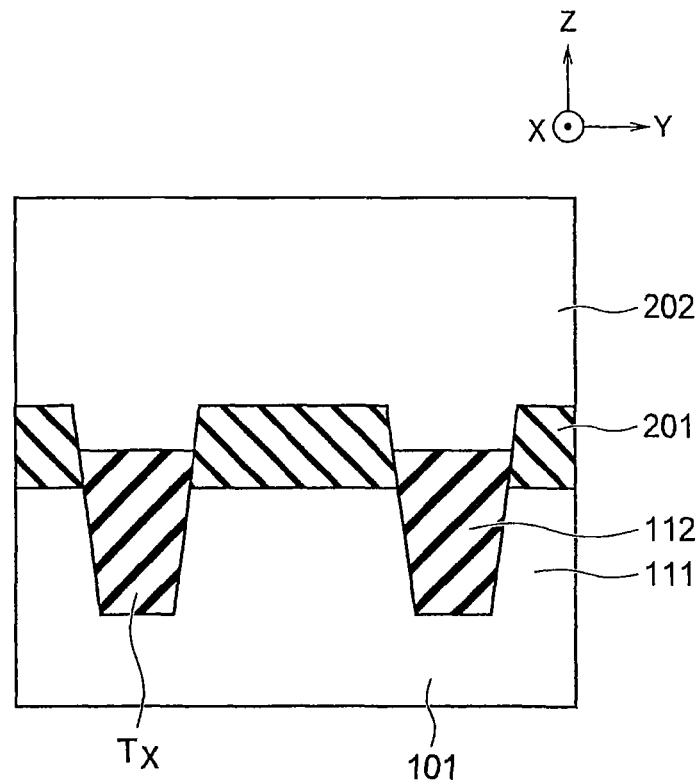

As shown in FIGS. 5A and 5B, after the peripheral circuit part is covered with a resist film 202, the isolation insulators 112 in the memory cell array part is recessed by wet etching.

In this case, the height of the upper surfaces of the isolation insulators 112 in the memory cell array part is made lower than the height of the upper surfaces of the device regions 111.

Figure 6A:
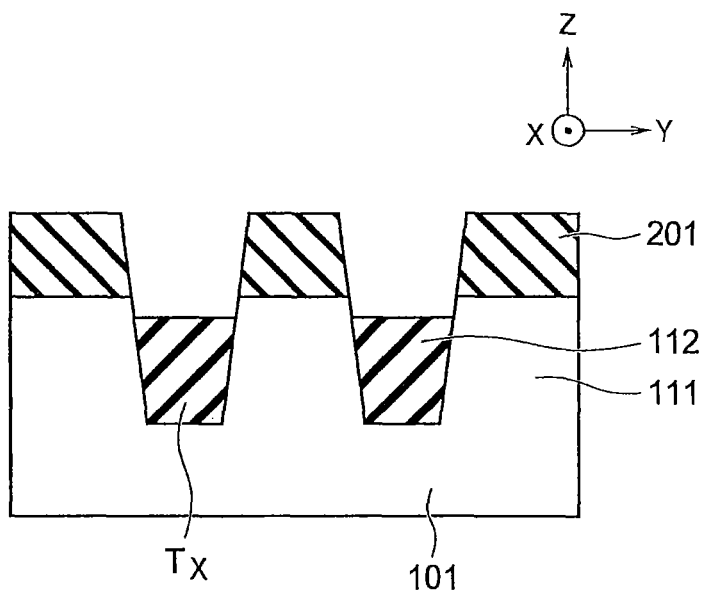
Figure 6B:
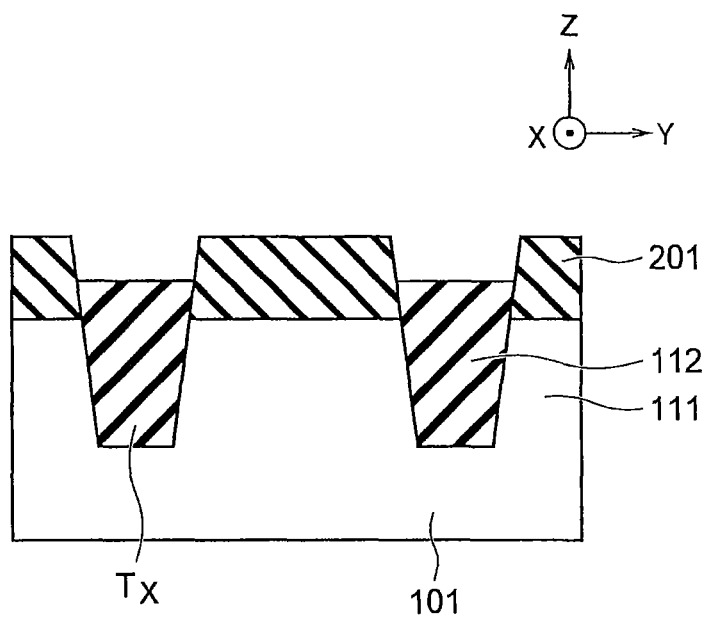

As shown in FIGS. 6A and 6B, the resist film 202 is then removed.

Figure 7A:
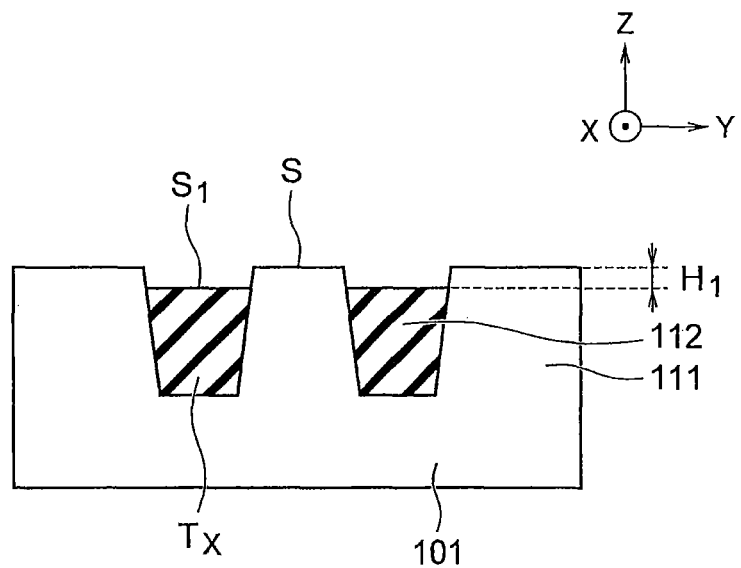
Figure 7B:
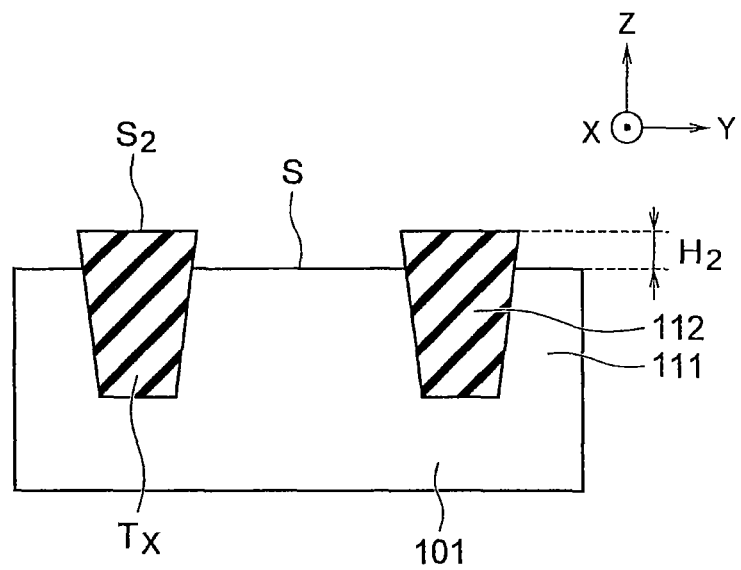

As shown in FIGS. 7A and 7B, the hard mask layer 201 is then removed. In this way, the isolation insulators 112 are formed which have different heights in the memory cell array part and in the peripheral circuit part. More specifically, the height of the upper surfaces "$S_1$" of the isolation insulators 112 in the memory cell array part is set lower than the height of the upper surface "S" of the semiconductor substrate 101 (device regions 111). In addition, the height of the upper surfaces "$S_2$" of the isolation insulators 112 in the peripheral circuit part is set higher than the height of the upper surface "S" of the semiconductor substrate 101 (device regions 111).

In general, the peripheral transistors are formed to have planar structures. Accordingly, if the height of the upper surfaces "$S_2$" is lower than the height of the upper surface "S", parasitic channels are formed on recessed sidewall portions of the peripheral transistors, which exerts an adverse influence on the characteristics of the peripheral transistors. Therefore, the height of the upper surfaces "$S_2$" in the present embodiment is set higher than the height of the upper surface "S". As a result, the line width "$W_4$" becomes smaller than the line width "$W_3$" in a self-aligned manner as described later.

On the other hand, if the memory cell transistors are formed to have embedded-channel structures or the like and the channels are formed at positions deeper than the upper surfaces "$S_1$", the above problem will not arise even in the case where the height of the upper surfaces "$S_1$" is lower than the height of the upper surface "S". Therefore, the height of the upper surfaces "$S_1$" in the present embodiment is set lower than the height of the upper surface "S", so that the line width "$W_2$" becomes larger than the line width "$W_1$" in a self-aligned manner as described later.

Reference sign "$H_1$" denotes a difference in height between the upper surfaces "$S_1$" and the upper surface "S", and reference sign "$H_2$" denotes a difference in height between the upper surfaces "$S_2$" and the upper surface "S". In the present embodiment, the values of "$H_1$" and "$H_2$" are set into 5 to 15 nm (e.g., 10 nm).

FIG. 8A is a plan view showing the memory cell array part. FIGS. 8B and 8C are sectional views taken along a line A-A' and a line E-E' shown in FIG. 8A, respectively. FIG. 9A is a plan view showing the peripheral circuit part. FIGS. 9B and 9C are sectional views taken along a line C-C' and a line F-F' shown in FIG. 9A, respectively.

Next, as shown in FIGS. 8A to 9C, the trenches $T_Y$ extending in the direction Y are formed in the device regions 111 and the isolation regions 112. The trenches $T_Y$ are used to form embedded channels. As shown in FIGS. 8A to 9C, the gate insulator 113 is then formed on the surface of the semiconductor substrate 101. As shown in FIGS. 8A to 9C, gate electrode materials 114a and 114b (a polysilicon film and a metal film) for forming the gate electrode 114, and the hard mask layer 115 are then formed on the entire surface of the semiconductor substrate 101 sequentially.

As shown with reference signs "$P_1$" and "$P_2$", stepped portions corresponding to the recessed amounts of the isolation regions 112 are formed on the surface of the hard mask layer 115. In the memory cell array part, recess sections "$P_1$" are formed above the isolation regions 112. In the peripheral circuit part, protruding sections "$P_2$" are formed above the isolation regions 112.

Figure 10A:
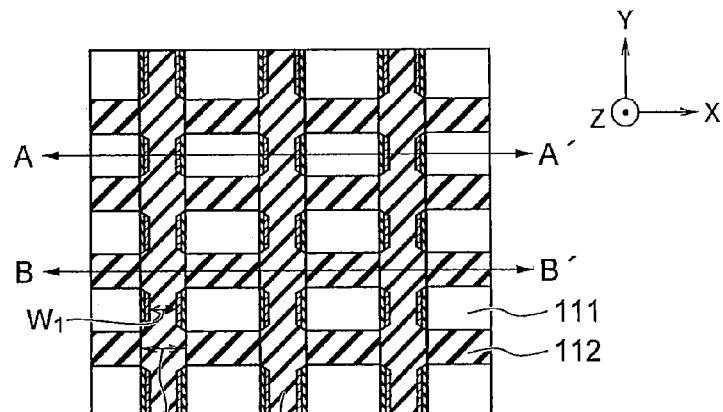
Figure 10B:
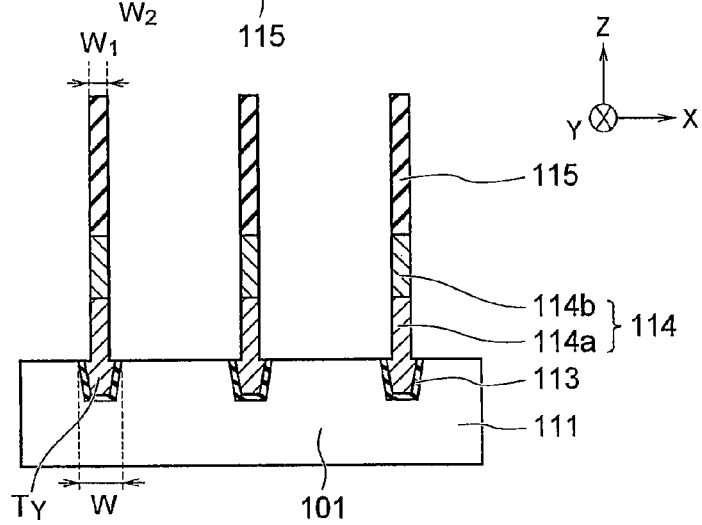
Figure 10C:
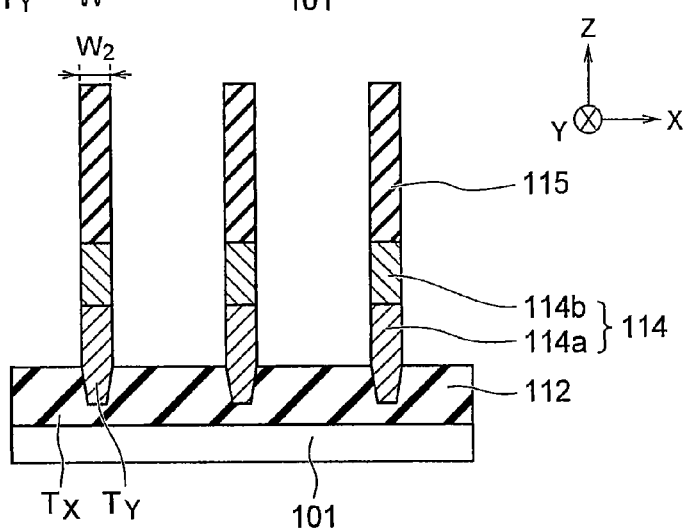
Figure 11A:
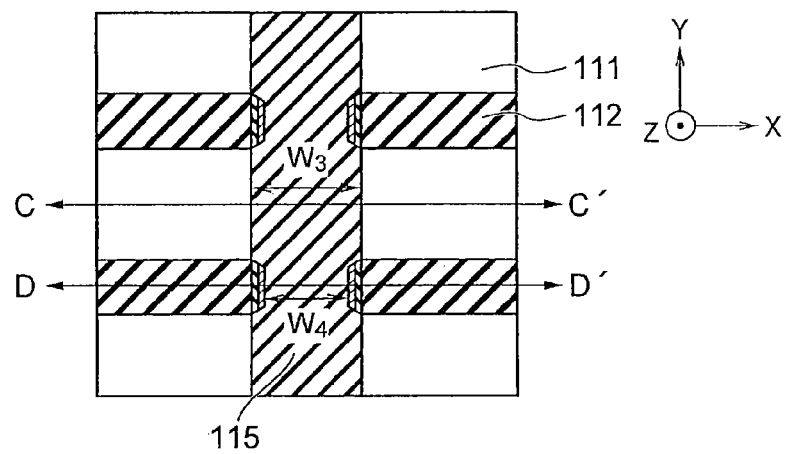
Figure 11B:
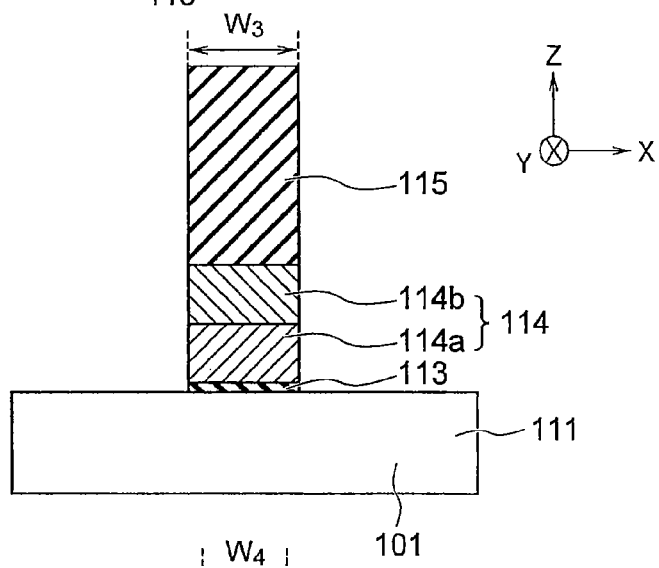
Figure 11C:
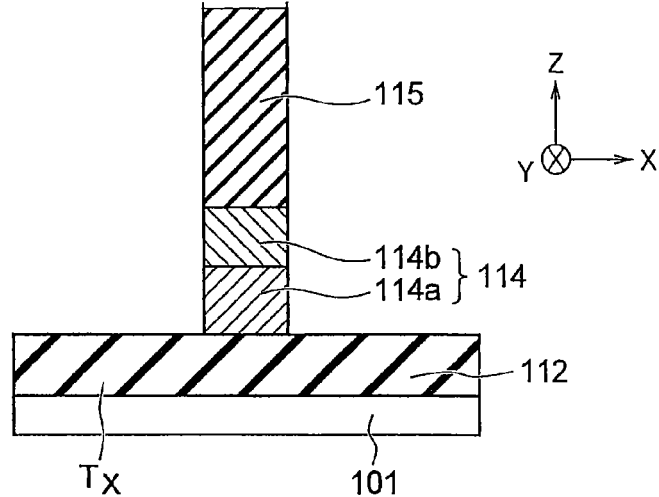

FIG. 10A is a plan view showing the memory cell array part. FIGS. 10B and 10C are sectional views taken along a line A-A' and a line B-B' of FIG. 10A, respectively. FIG. 11A is a plan view showing the peripheral circuit part. FIGS. 11B and 11C are sectional views taken along a line C-C' and a line D-D' of FIG. 11A, respectively.

As shown in FIGS. 10A to 11C, the hard mask layer 115 and the gate electrode materials 114a and 114b are then etched so that the gate electrode 114 is formed from the gate electrode materials 114a and 114b.

In this step, since the upper surfaces of the isolation regions 112 in the memory cell array part are lower than the upper surfaces of the device regions 111, the gate electrode materials 114a and 114b and the hard mask layer 115 on the isolation regions 112 tend to have low etching rates. As a result, the line width "$W_2$" of the word lines (gate electrodes) 114 on the isolation regions 112 becomes larger than the line width "$W_1$" of the word lines 114 on the device regions 111 in a self-aligned manner.

On the other hand, since the upper surfaces of the isolation regions 112 in the peripheral circuit part is higher than the upper surface of the device regions 111, the gate electrode materials 114a and 114b and the hard mask layer 115 on the isolation regions 112 tend to have high etching rates. As a result, the line width "$W_4$" of the gate lines (gate electrodes) 114 on the isolation regions 112 becomes smaller than line width "$W_3$" of the gate lines 114 on the device regions 111 in a self-aligned manner.

The line width "$W_2$" can be increased by making the recess sections "$P_1$" deeper. The line width "$W_4$" can be decreased by making the protruding sections "$P_2$" higher. The depth of the recess sections "$P_1$" and the height of the protruding sections "$P_2$" can be controlled by adjusting the values of "$H_1$" and "$H_2$" shown in FIGS. 7A to 7B.

Although the gate electrode 114 in the present embodiment is formed of the polysilicon film 114a and the metal film 114b, the gate electrode 114 may be formed only of the metal film 114b. The gate electrode 114 may include two or more metal films.

In the present embodiment, the sidewall insulators 116, the inter layer dielectric 121, the contact plugs 122, the inter layer dielectric 123, the capacitors 124, the via plugs 125 and the like are then formed. In addition, various line layers (interconnect layers), inter layer dielectrics, via plugs are formed. In this way, the semiconductor device shown in FIGS. 1A to 2C is manufactured.

(4) Effects of First Embodiment

Finally, effects of the first embodiment will be described.

As described above, in the memory cell array part of the present embodiment, the line width "$W_2$" of the word lines 114 on the isolation regions 112 is set larger than the line width "$W_1$" of the word lines 114 on the device regions 111.

Therefore, according to the present embodiment, the increase of the line width "$W_2$" makes it possible to reduce the thin line effect of the word lines 114 on the isolation regions 112, and to thereby reduce the resistivity of the word lines 114 on the isolation regions 112. As a result, according to the present embodiment, it becomes possible to decrease the resistance of the word lines 114 and to suppress variations in resistance of the word lines 114.

In addition, in the memory cell array part of the present embodiment, the height of the upper surfaces of the isolation regions 112 is set lower than the height of the upper surface of the semiconductor substrate 101.

Therefore, according to the present embodiment, by forming the word lines 114 under this setting, the line width "$W_2$" can be made larger than the line width "$W_1$" in a self-aligned manner.

(Second Embodiment)

Figure 12A:
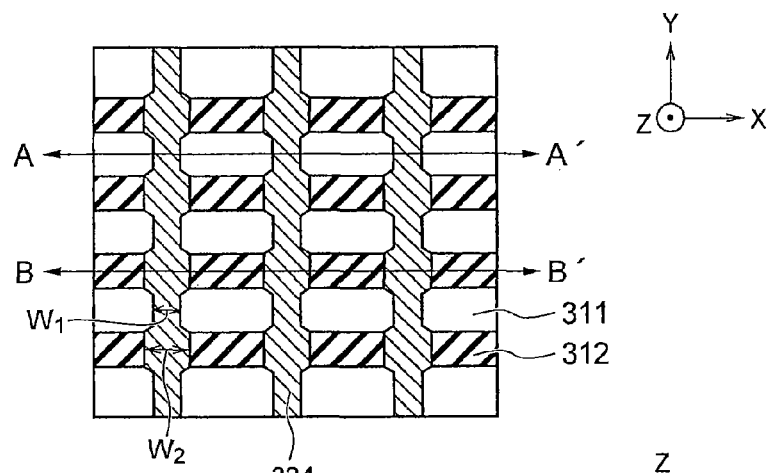
FIGS. 12A to 12C are a plan view and sectional views showing a structure of a semiconductor device of a second embodiment.
Figure 12B:
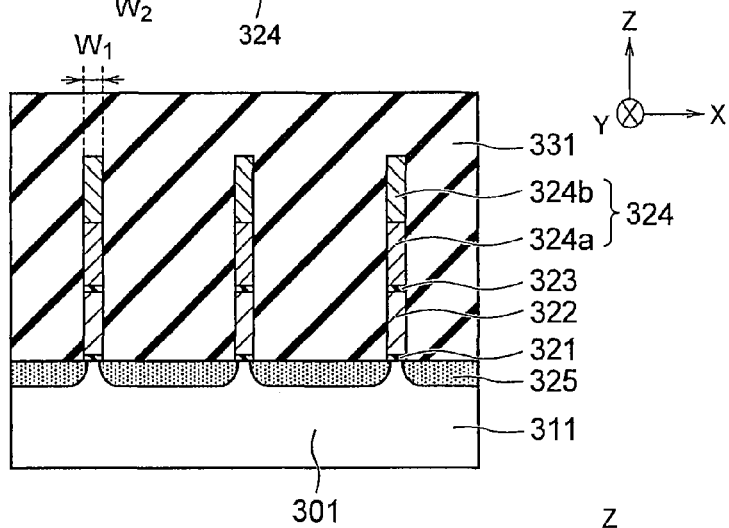
Figure 12C:
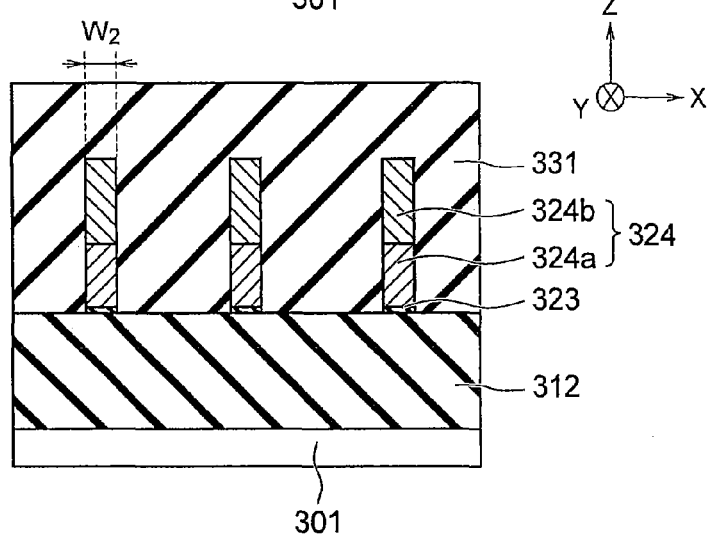

FIGS. 12A to 12C are a plan view and sectional views showing a structure of a semiconductor device of a second embodiment. The semiconductor device of FIGS. 12A to 12C is a NAND flash memory.

FIG. 12A is a plan view showing a structure of a memory cell array part on a semiconductor substrate 301. FIGS. 12B and 12C are sectional views taken along a line A-A' and a line B-B' shown in FIG. 12A, respectively. FIGS. 12A to 12C show memory cell transistors formed in the memory cell array part.

The semiconductor device of FIGS. 12A to 12C includes the semiconductor substrate 301, device regions 311, and isolation regions 312. Each memory cell transistor of the semiconductor device of FIGS. 12A to 12C includes a gate insulator 321, a floating gate 322, an intergate insulator 323, a control gate 324, and diffusion layers 325. The semiconductor device of FIGS. 12A to 12C further includes an inter layer dielectric 331.

The structures of the semiconductor substrate 301, the device regions 311 and the isolation regions 312 are almost similar to those in the first embodiment.

The gate insulator 321, the floating gate 322, the inter gate insulator 323, and the control gate 324 are sequentially formed on the semiconductor substrate 301. The control gate 324 is, for example, a stack film formed by sequentially stacking a polysilicon film 324a and a metal film 324b. The polysilicon film 324a is an example of a semiconductor film of the disclosure. Examples of the metal film 324b include a tungsten film. The diffusion layers 325 are formed in the semiconductor substrate 301 to sandwich the floating gate 322 and the control gates 324.

The floating gate 322 is formed between the isolation regions 312, similarly to the device regions 311 formed between the isolation regions 312. The gate electrode 324 extends in the direction Y, and is formed on the device regions 311 and the isolation regions 312. The control gate 324 in FIGS. 12A to 12C is also used as an interconnect of the NAND flash memory, more specifically, as a word line. The gate electrode 324 in FIGS. 12A to 12C is an example of a first line of the disclosure.

The inter layer dielectric 331 is formed on the semiconductor substrate 301 so as to cover the memory cell transistors. The inter layer dielectric 331 is, for example, a silicon oxide film.

The AA section shown in FIG. 12B is now compared with the STI section shown in FIG. 12C.

In the present embodiment, the line width "$W_2$" of the word lines (control gates) 324 on the isolation regions 312 is set larger than the line width "$W_1$" of the word lines 324 on the device regions 311 ($W_2 > W_1$), similarly to the first embodiment. Therefore, according to the present embodiment, it becomes possible to decrease the resistance of the word lines 324 on the isolation regions 312, thereby decreasing the total resistance of the word lines 324.

According to the present embodiment, the increase of the line width "$W_2$" makes it possible to reduce the thin line effect of the word lines 324 on the isolation regions 312, and to thereby reduce the resistivity of the word lines 324 on the isolation regions 312. Therefore, according to the present embodiment, it becomes possible to decrease the resistance of the word lines 324 and to suppress variations in resistance of the word lines 324, similarly to the first embodiment.

In the memory cell array part of the present embodiment, the height of the upper surfaces of the isolation regions 312 is set lower than the height of the upper surface of the floating gates 322. In the present embodiment, the control gates 324 are formed under this setting, so that the line width "$W_2$" becomes larger than the line width "$W_1$." in a self-aligned manner, similarly to the first embodiment.

The structure of a peripheral circuit part of the present embodiment is almost similar to that in the first embodiment. However, the gate electrodes of the peripheral transistors in the present embodiment are formed of an electrode material which forms the floating gates 322 and an electrode material which forms the control gates 324.

Finally, effects of the second embodiment will be described.

As described above, in the memory cell array part of the present embodiment, the line width "$W_2$" of the word lines 324 on the isolation regions 312 is set larger than the line width "$W_1$" of the word lines 324 on the device regions 311. Therefore, according to the present embodiment, it becomes possible to decrease the resistance of the word lines 324 and to suppress variations in resistance of the word lines 324, similarly to the first embodiment.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor substrate;
isolation regions disposed in the semiconductor substrate;
device regions disposed between the isolation regions in the semiconductor substrate;
a first line disposed in a memory cell array part on the semiconductor substrate, and disposed on the device regions and the isolation regions, a line width of the first line on the isolation regions being larger than a line width of the first line on the device regions; and
a second line disposed in a peripheral circuit part on the semiconductor substrate, and disposed on the device regions and the isolation regions, a line width of the second line on the isolation regions being smaller than a line width of the first line on the device regions.

2. The device of claim 1, wherein a height of upper surfaces of the isolation regions in the memory cell array part is lower than a height of the semiconductor substrate.

3. The device of claim 2, wherein a difference between the height of the upper surfaces of the isolation regions and the height of the upper surface of the semiconductor substrate in the memory cell array part is 5 to 15 nm.

4. The device of claim 1, wherein a height of upper surfaces of the isolation regions in the peripheral circuit part is higher than a height of the semiconductor substrate.

5. The device of claim 4, wherein a difference between the height of the upper surfaces of the isolation regions and the height of the upper surface of the semiconductor substrate in the peripheral circuit part is 5 to 15 nm.

6. The device of claim 1, wherein the first line is a gate electrode disposed on the semiconductor substrate via a gate insulator.

7. The device of claim 1, wherein the first line is a control gate disposed on the semiconductor substrate via a gate insulator, a floating gate, and an intergate insulator.

8. The device of claim 1, wherein the first line comprises a semiconductor film and a metal film disposed on the semiconductor film.

* * * * *